(12) United States Patent
Kim

(10) Patent No.: US 11,890,855 B2
(45) Date of Patent: Feb. 6, 2024

(54) DISPLAY DEVICE HAVING IMPACT RESISTANCE LAYER

(71) Applicant: Samsung Display Co., Ltd., Yongin-si (KR)

(72) Inventor: Min-Sung Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 28 days.

(21) Appl. No.: 17/365,156

(22) Filed: Jul. 1, 2021

(65) Prior Publication Data

US 2022/0159846 A1 May 19, 2022

(30) Foreign Application Priority Data

Nov. 16, 2020 (KR) ........................ 10-2020-0152904

(51) Int. Cl.
*B32B 7/12* (2006.01)
*B32B 3/18* (2006.01)
(Continued)

(52) U.S. Cl.
CPC .................. *B32B 7/12* (2013.01); *B32B 3/18* (2013.01); *B32B 7/022* (2019.01); *B32B 15/00* (2013.01);
(Continued)

(58) Field of Classification Search
CPC .. B32B 3/12; B32B 7/022; B32B 7/12; B32B 15/08; B32B 27/08; B32B 2307/51; B32B 2307/558; B32B 2457/20
See application file for complete search history.

(56) References Cited

U.S. PATENT DOCUMENTS 9,857,957 B2    1/2018   Lee et al.
9,923,156 B2    3/2018   Jeong
(Continued)

FOREIGN PATENT DOCUMENTS

KR    1020150015290 A    2/2015
KR    1020160031001 A    3/2016
(Continued)

OTHER PUBLICATIONS

PCT Examination Report for PCT/KR2021/013213 dated Dec. 31, 2021.

*Primary Examiner* — Christopher M Polley
*Assistant Examiner* — Sathavaram I Reddy
(74) *Attorney, Agent, or Firm* — CANTOR COLBURN LLP

(57) ABSTRACT

A display device includes a display panel and an impact resistance layer. The display panel includes a first display area, a second display area, a first folding display area between the first display area and the second display area, a third display area, and a second folding display area between the second display area and the third display area. The first folding display area is out-foldable such that the first display area is faces outside the display device. The impact resistance layer includes a first portion corresponding to the first display area, the first folding display area and the second display area and a second portion corresponding to the second display area, the second folding display area, and the third display area. The first portion has an elastic modulus greater than the second portion.

21 Claims, 14 Drawing Sheets

(51) Int. Cl.
*B32B 15/08* (2006.01)
*B32B 27/08* (2006.01)
*B32B 7/022* (2019.01)
*B32B 15/00* (2006.01)

(52) U.S. Cl.
CPC .......... *B32B 27/08* (2013.01); *B32B 2307/51* (2013.01); *B32B 2307/558* (2013.01); *B32B 2457/20* (2013.01)

(56) References Cited

U.S. PATENT DOCUMENTS

| | | | |
|---|---|---|---|
| 10,083,636 | B2 | 9/2018 | Han |
| 10,319,291 | B2 | 6/2019 | Ikeda et al. |
| 10,433,436 | B2 | 10/2019 | Kim et al. |
| 10,711,980 | B2 | 7/2020 | Hirakata et al. |
| 2013/0010405 | A1 | 1/2013 | Rothkopf et al. |
| 2015/0036312 | A1 | 2/2015 | Seo |
| 2016/0378246 | A1* | 12/2016 | Kim ................. B32B 27/308 345/173 |
| 2017/0025634 | A1* | 1/2017 | Jeong ................ H01L 51/0097 |
| 2018/0149786 | A1* | 5/2018 | Lee .......................... G02B 1/08 |

FOREIGN PATENT DOCUMENTS

| | | |
|---|---|---|
| KR | 1020160033106 A | 3/2016 |
| KR | 1020160144912 A | 12/2016 |
| KR | 1020170012739 A | 2/2017 |
| KR | 1020180021299 A | 3/2018 |
| KR | 1020180040187 A | 4/2018 |
| KR | 1020200052643 A | 5/2020 |

* cited by examiner

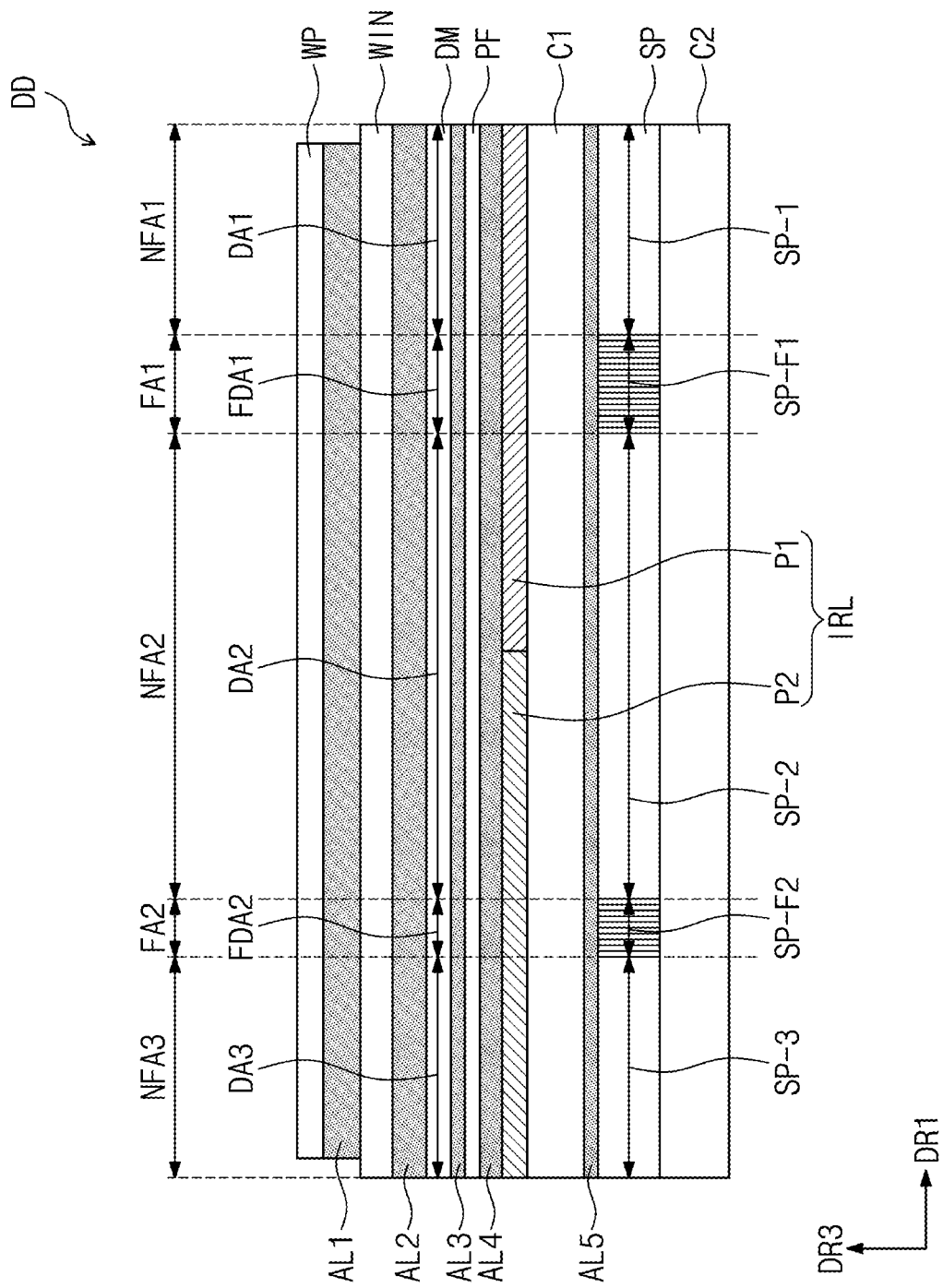

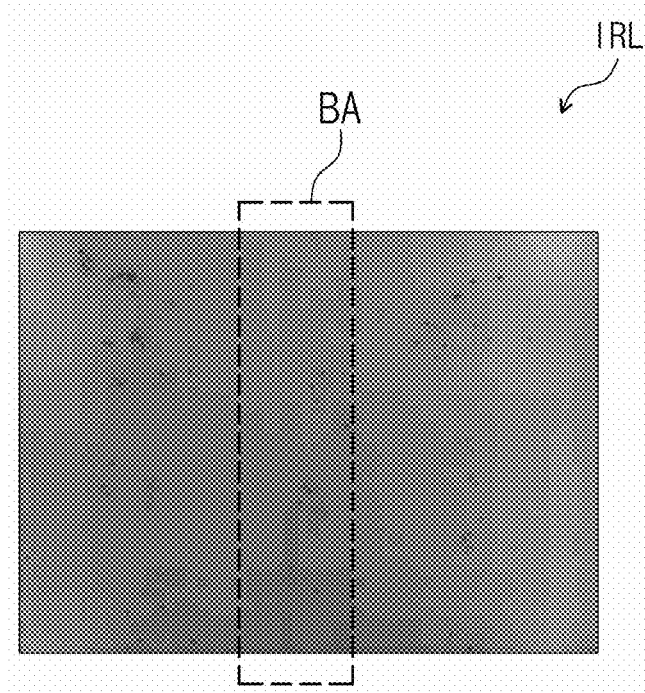

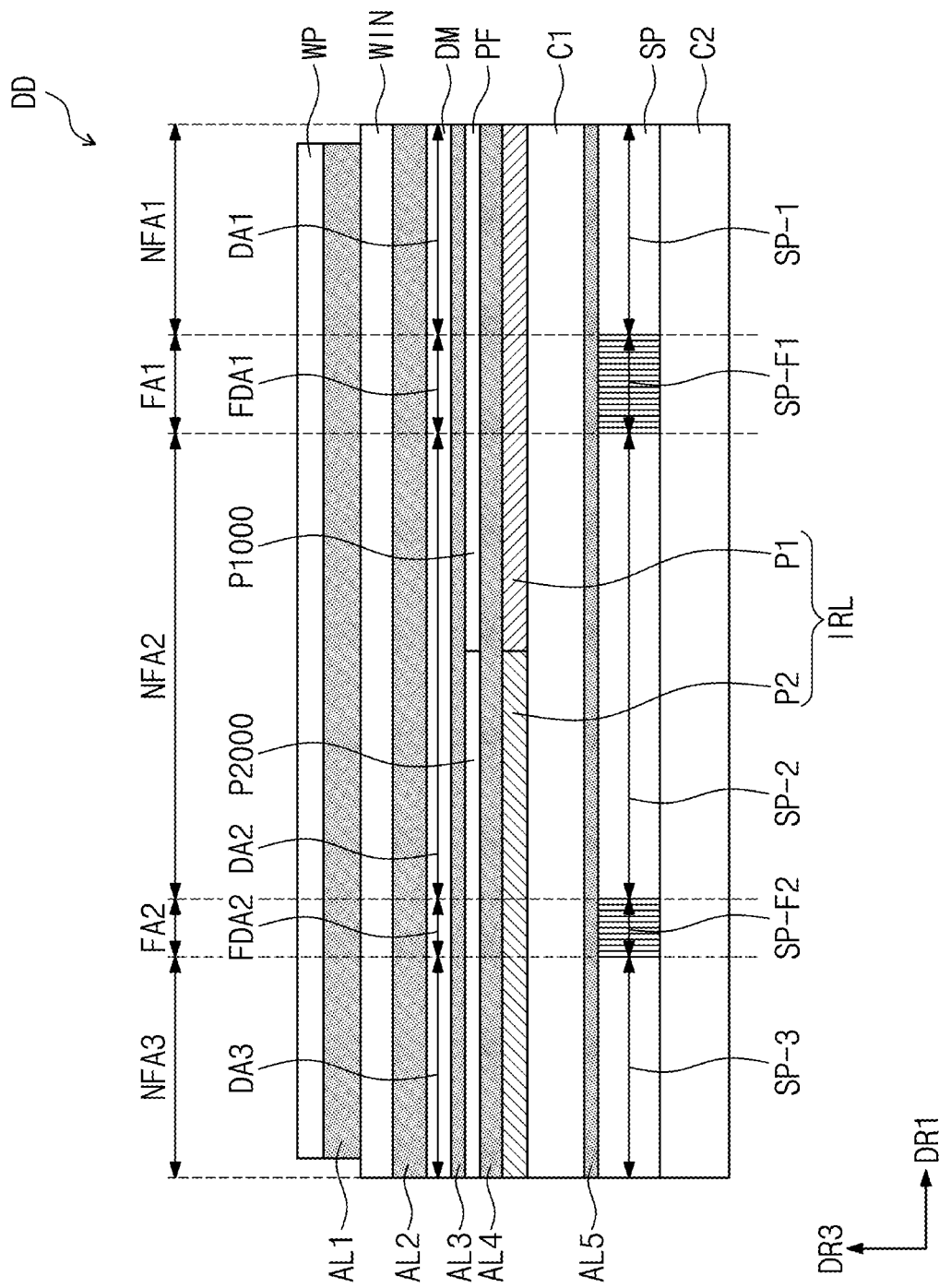

DISPLAY DEVICE HAVING IMPACT RESISTANCE LAYER

This U.S. application claims priority to Korean Patent Application No. 10-2020-0152904, filed on Nov. 16, 2020, the contents of which are hereby incorporated by reference in its entirety.

BACKGROUND

1. Field

The disclosure relates to a display device. More particularly, the disclosure relates to a foldable display device.

2. Description of the Related Art

A display device includes an active area that is activated in response to electrical signals. The display device senses an input applied thereto from outside of the display device through the active area and substantially simultaneously displays images to provide a user with information. As display devices of various shapes have been developed, the active areas are being implemented to have various shapes. In addition, display devices in which the shape of the active area is variable according to a use of the display devices are being developed.

SUMMARY

Embodiments provide a display device having an improved impact resistance.

Embodiments provide a display device including a display panel and an impact resistance layer. The display panel includes a first display area, a second display area, a first folding display area defined between the first display area and the second display area, a third display area, and a second folding display area defined between the second display area and the third display area, the first folding display area is folded at a first curvature radius such that the first display area is disposed toward an outside, and the second folding display area is folded at a second curvature radius such that the second display area faces the third display area. The impact resistance layer is under the display panel. The impact resistance layer includes a first portion overlapping the first display area and a second portion overlapping the third display area, and the first portion has an elastic modulus greater than the second portion.

The first portion may further overlap the first folding display area and a portion of the second display area, and the second portion may further overlap another portion of the second display area and the second folding display area.

The first curvature radius may be greater than the second curvature radius.

The elastic modulus of the first portion may be within a range from about 100 gigapascals (GPa) to about 200 GPa, and the elastic modulus of the second portion may be within a range from about 4 GPa to about 10 GPa.

The first portion may include a metal sheet, and the second portion may include a plastic film.

The metal sheet may include Invar or a steel use stainless ("SUS").

The first portion and the second portion may have substantially a same thickness as each other.

A gap between the first portion and the second portion may be equal to or smaller than about 100 micrometers.

The first display area, the first folding display area, the second display area, the second folding display area, and the third display area are consecutively are arranged in a first direction, and a boundary between the first portion and the second portion is disposed at a portion within a range of about 45% to about 55% of a length in the first direction of the display panel from one side edge of the display panel.

The display device may further include a foam resin. Each of the first portion and the second portion may include a first surface adjacent to the display panel and a second surface farther away from the display panel than the first surface is, and the foam resin may be disposed directly on the second surface of each of the first portion and the second portion.

The display device may further include a support plate including a first area, a second area, a first folding area, a third area and a second folding area respectively corresponding to the first display area, the second display area, the first folding display area, the third display area and the second folding display area. The impact resistance layer may be between the display panel and the support plate.

Each of the first folding area and the second folding area is provided with a plurality of openings defined therein.

The display device further includes a protective film may be between the display panel and the impact resistance layer.

The display device may further include a window on the display panel.

The display device may further include a window protective layer on the window, and the window protective layer may be attachable to and detachable from the window.

The display device may further include an input sensor on the display panel.

Embodiments provide a display device including a window, a display module, a support plate, a metal sheet and a plastic film. The support plate is under the display module and includes a first area, a second area, a first folding area defined between the first area and the second area, a third area, and a second folding area defined between the second area and the third area. The metal sheet is between the display module and the support plate and overlaps at least the first area. The plastic film is between the display module and the support plate and overlaps at least the third area. The metal sheet and the plastic film are attached to a first adhesive layer attached to a lower surface of the display module. When the support plate is folded in each of the first folding area and the second folding area, a first display area of the display module corresponding to the first area is exposed to an outside, and a second display area and a third display area of the display module corresponding to the second area and the third area face each other.

The display module may include a display panel, an input sensor on the display panel, and a protective film under the display panel. The first adhesive layer may be attached to the protective film.

The first area, the first folding area, the second area, the second folding area and the third area may be consecutively arranged in a first direction, and a width in the first direction of the first folding area may be greater than a width in the first direction of the second folding area.

Each of the first folding area and the second folding area may be provided with a plurality of openings defined therein.

A boundary between the metal sheet and the plastic film may overlap the second area.

According to one or more embodiment described above, an impact resistance of the first display area exposed to the outside in the folded state is improved since the impact resistance layer having a large elastic modulus is able to withstand an external impact.

The boundary between the first portion and the second portion of the impact resistance layer is disposed at the center portion of the display panel where the adhesive layer moves less during the transition of folding and unfolding operations, and thus, a phenomenon in which the boundary between the first portion and the second portion is perceived is reduced or effectively prevented.

The first portion of the impact resistance layer covers the first folding area of the support plate and reduced or prevents the first folding area of the support plate from being perceived from the outside.

BRIEF DESCRIPTION OF THE DRAWINGS

The above and other advantages of the invention will become readily apparent by reference to the following detailed description when considered in conjunction with the accompanying drawings where:

FIG. 2A is a cross-sectional view showing an embodiment of a display device which is unfolded;

FIG. 4C is an image showing a photograph image of an embodiment of the display device which is unfolded;

FIG. 5C is a cross-sectional view showing an embodiment of a display device which is unfolded;

DETAILED DESCRIPTION

Figure 1A:
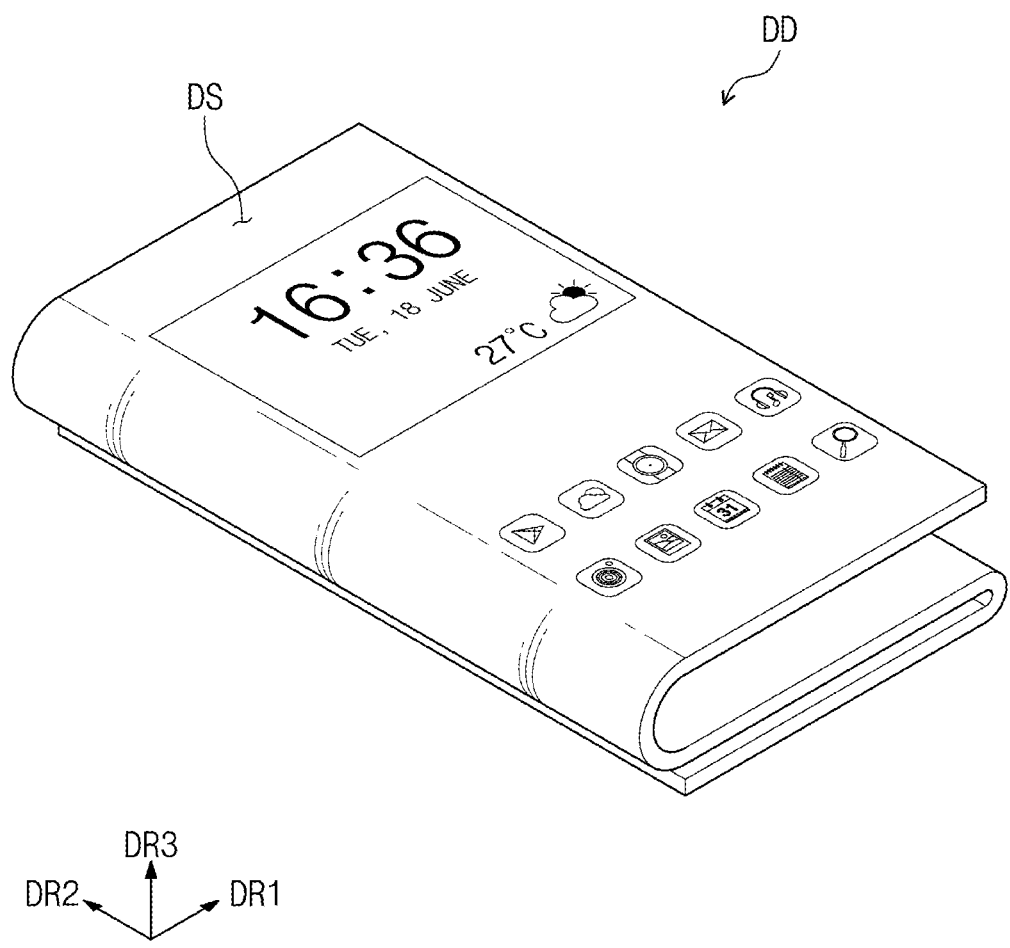
FIG. 1A is a perspective view showing an embodiment of a display device which is folded.

In the present disclosure, it will be understood that when an element or layer is referred to as being related to another such as being "on," "connected to" or "coupled to" another element or layer, it can be directly on, connected or coupled to the other element or layer or intervening elements or layers may be present. In contrast, when an element or layer is referred to as being related to another such as being "directly on," "directly connected to" or "directly coupled to" another element or layer, no other element or layer or intervening elements or layers are present.

Like numerals refer to like elements throughout. In the drawings, the thickness, ratio, and dimension of components are exaggerated for effective description of the technical content.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

As used herein, the singular forms, "a," "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to accompanying drawings.

Figure 1B:
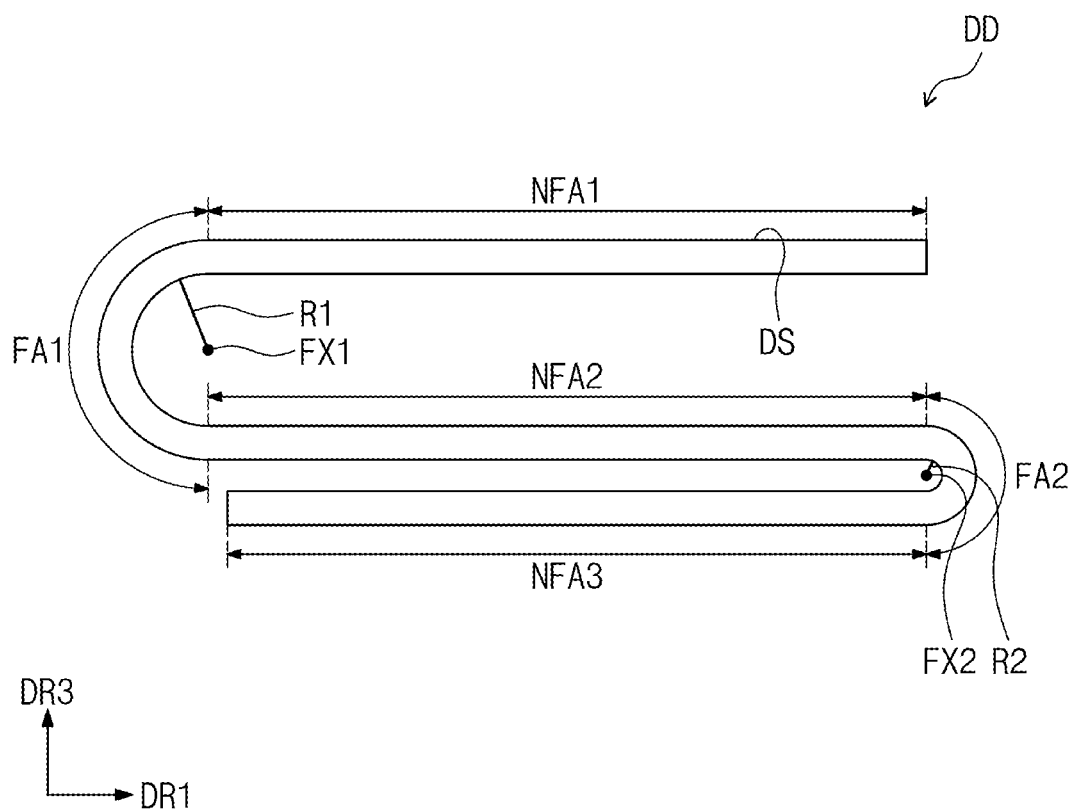
FIG. 1B is a side view showing an embodiment of a display device which is folded.
Figure 1C:
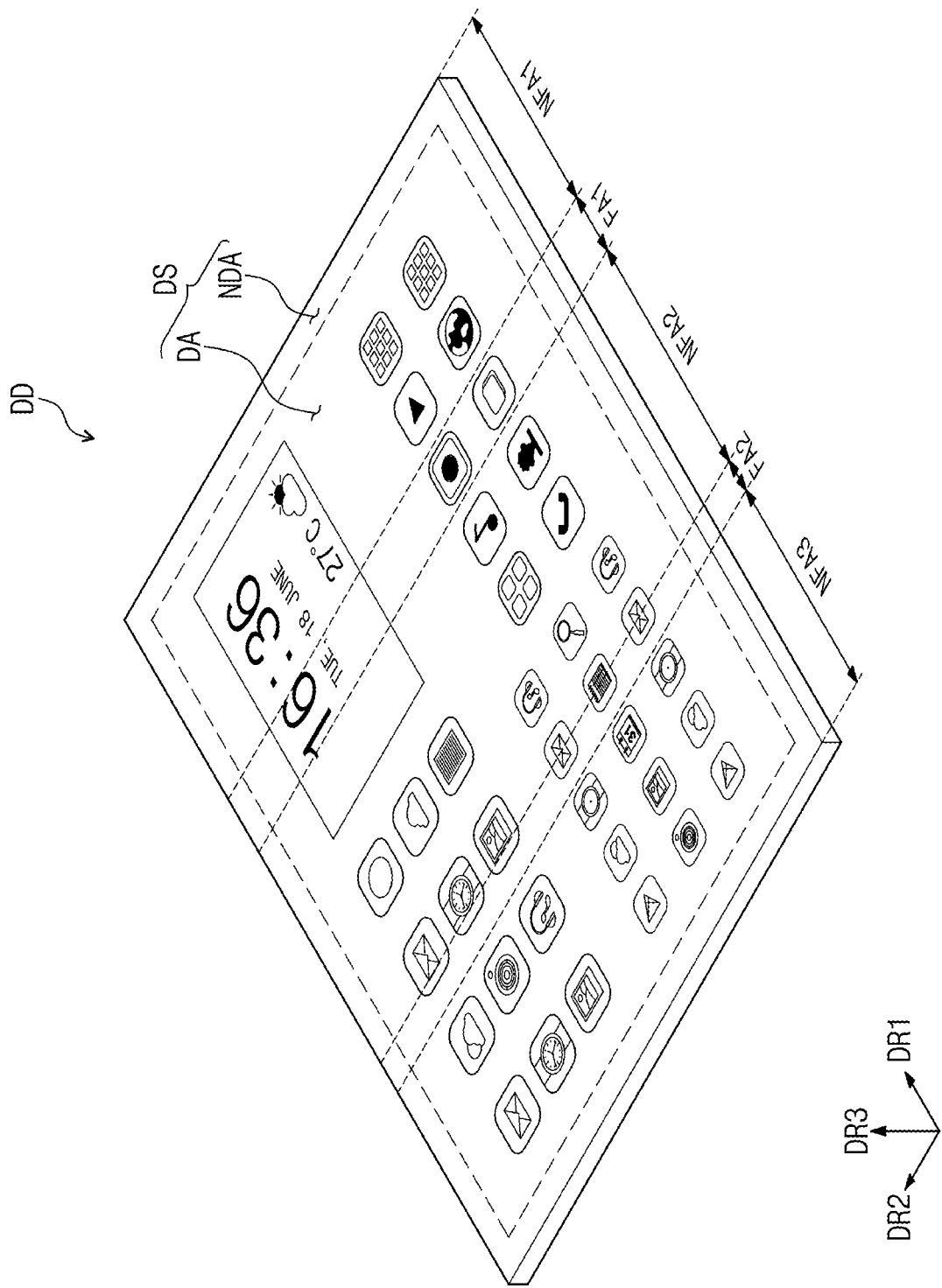
FIG. 1C is a perspective view showing an embodiment of a display device which is unfolded.

FIG. 1A is a perspective view showing a display device DD which is folded. FIG. 1B is a cross-sectional side view showing the display device DD which is folded. FIG. 1C is a perspective view showing the display device DD which is unfolded.

Referring to FIGS. 1A to 1C, the display device DD which is unfolded may have a rectangular shape defined by long sides extended along a first direction DR1 and short sides extended along a second direction DR2 which cross the first direction DR1. However, the display device DD should not be limited to the rectangular shape and may have a variety of shapes, such as a circular shape, a polygonal shape or the like.

Hereinafter, a direction substantially perpendicular to a plane defined by the first direction DR1 and the second direction DR2 crossing each other may be referred to as a third direction DR3. In the following descriptions, the expression "when viewed in a plane," "in a plan view" or "on a plane" means a view along the third direction DR3. Hereinafter, the first, second and third directions DR1, DR2 and DR3 are directions respectively indicated by first, second and third directional axes and direction and directional axis are assigned with the same reference numerals.

The display device DD may include a plurality of folding areas FA1 and FA2 at which the display device DD is foldable and a plurality of non-folding areas NFA1, NFA2, and NFA3 at which the display device DD is not foldable or which remains flat in the display device DD which is bent at one or more folding area. Various components and layers of the display device DD may have a folding area and a non-folding area corresponding to one or more of those described above for the display device DD. Various components or layers of the display device DD may be foldable and unfoldable together with each other at a respective folding area.

Referring to FIGS. 1A to 1C, the display device DD includes a plurality of folding areas including a first folding area FA1 and a second folding area FA2, and a plurality of non-folding area including a first non-folding area NFA1, a second non-folding area NFA2 and a third non-folding area NFA3. Along the first direction DR1, the first folding area FA1 may be disposed between the first non-folding area NFA1 and the second non-folding area NFA2, and the second folding area FA2 may be disposed between the second non-folding area NFA2 and the third non-folding area NFA3. Two folding areas FA1 and FA2 and three non-folding areas NFA1, NFA2 and NFA3 are shown in FIGS. 1A to 1C, however, the number of the folding areas FA1 and FA2 and the number of the non-folding areas NFA1, NFA2, and NFA3 are not limited thereto or thereby and may increase.

Referring to FIGS. 1A to 1C, the display device DD which is unfolded or flat may include a display surface DS which is flat. Images generated by the display device DD may be provided to outside the display device DD through the display surface DS. The display surface DS may include a display area DA and a non-display area NDA which is adjacent to the display area DA. The images may be displayed through the display area DA and may not displayed through the non-display area NDA. In an embodiment, the non-display area NDA may surround the display area DA, however, should not be limited thereto or thereby, and a shape of the display area DA and a shape of the non-display area NDA may be changed. The display device DD and various components and layers thereof may have a display area DA and a non-display area NDA corresponding to those described above for the display surface DS.

FIGS. 1A and 1B, the display device DD may be foldable at the first folding area FA1 with respect to a first folding axis FX1 substantially parallel to the second direction DR2. The display device DD which is folded may include the first folding area FA1 having a curvature and a first curvature radius R1. The display device DD may be outwardly folded (e.g., out-folded) such that a portion of the display surface DS at the first non-folding area NFA1 faces outside of the display device DD and a portion of the display surface DS at the second non-folding area NFA2 faces away from the portion of the display surface DS at the first non-folding area NFA1.

The display device DD may be foldable at the second folding area FA2 with respect to a second folding axis FX2 substantially parallel to the second direction DR2. The display device DD which is folded may include the second folding area FA2 having a curvature and a second curvature radius R2. The display device DD may be inwardly folded (e.g., in-folded) such that the portion of the display surface DS at the second non-folding area NFA2 and a portion of the display surface DS at the third non-folding area NFA3 face each other and are relatively close to each other along a thickness direction (e.g., third direction DR3).

The first curvature radius R1 of the first folding area FA1 that is outwardly folded (e.g., out-folded) may be greater than the second curvature radius R2 of the second folding area FA2 that is inwardly folded (e.g., in-folded).

The display device DD which is folded defines a width along the first direction DR1. A width along the first direction DR1 of the first folding area FA1 and a width along the first direction DR1 of the second folding area FA2 may be determined depending on the first curvature radius R1 and the second curvature radius R2. Accordingly, the width along the first direction DR1 of the first folding area FA1 may be greater than the width along the first direction DR1 of the second folding area FA2.

According to an embodiment, an out-folding operation and an in-folding operation may occur substantially simultaneously, or only one of the out-folding operation and the in-folding operation may occur.

Figure 2B:
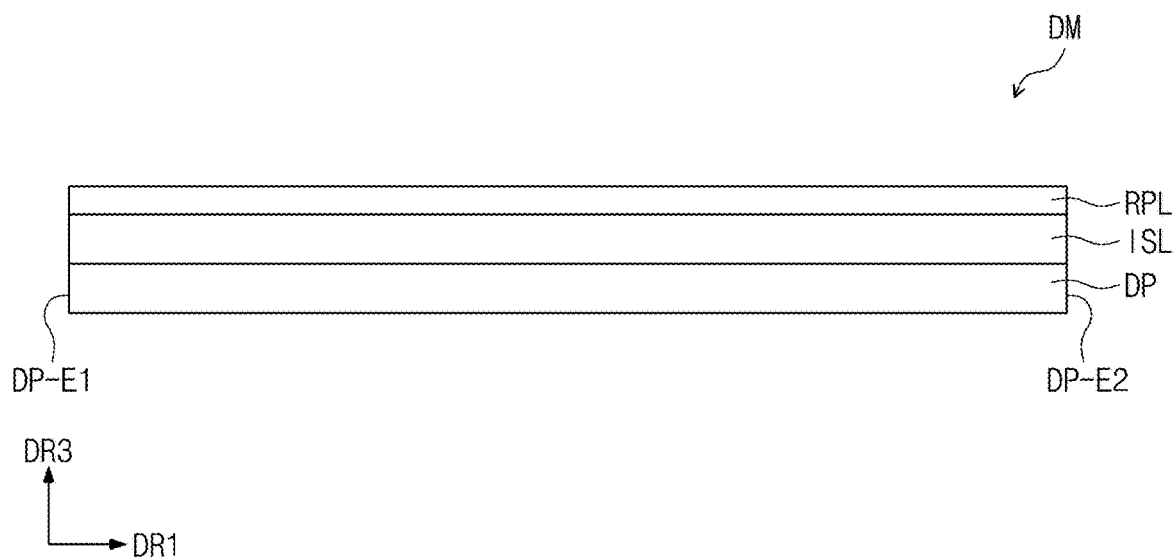
FIG. 2B is a cross-sectional view showing an embodiment of a display module which is unfolded.
Figure 2C:
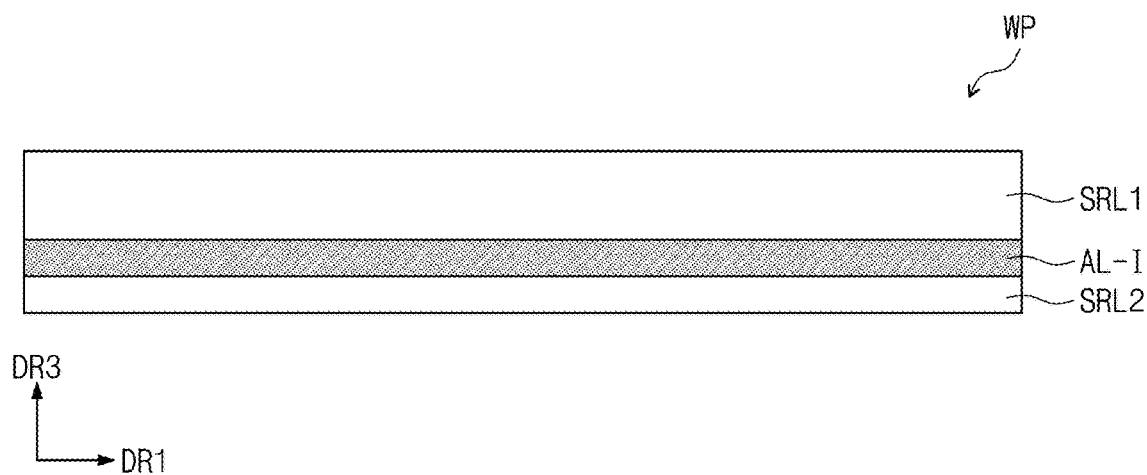
FIG. 2C is a cross-sectional view showing an embodiment of a window protective layer which is unfolded.
Figure 2D:
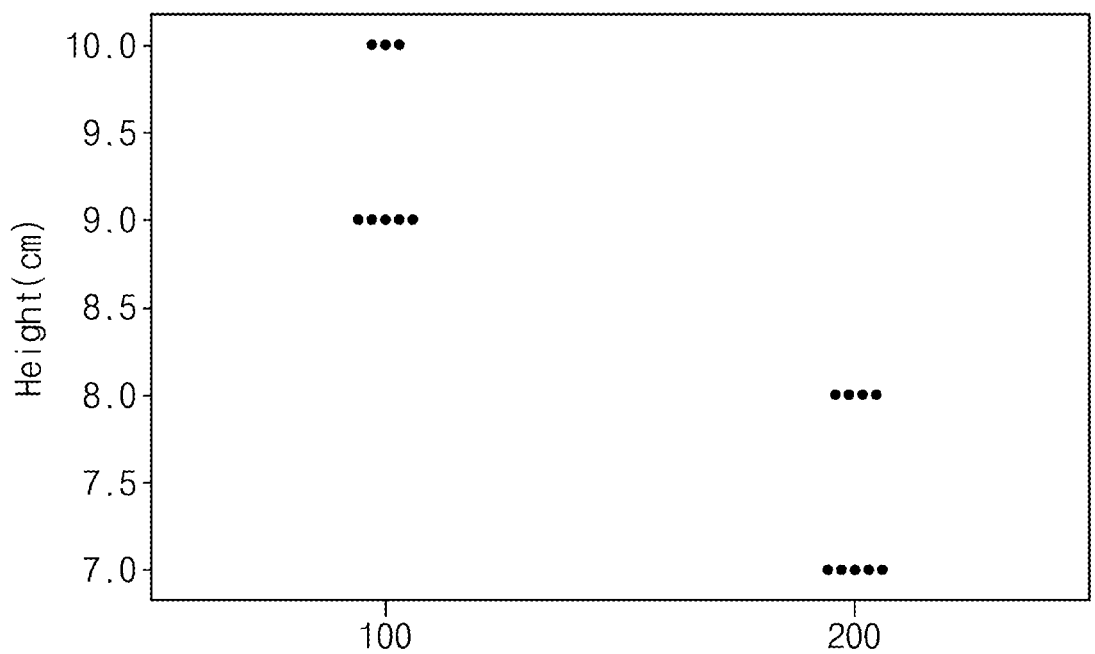
FIG. 2D is a graph showing impact resistance characteristics in a display area of an embodiment of a display device and a comparative display device.

FIG. 2A is a cross-sectional view showing the display device DD which is unfolded. FIG. 2B is a cross-sectional view showing a display module DM which is unfolded. FIG. 2C is a cross-sectional view showing a window protective layer WP which is unfolded. FIG. 2D is a graph showing impact resistance characteristics along the display area DA of an embodiment of the display device DD.

Referring to FIG. 2A, the display device DD may include the display module DM, a protective layer PF, an impact resistance layer IRL, a first cushion layer C1, a support plate SP, a second cushion layer C2, a window WIN, the window protective layer WP, and first to fifth adhesive layers AL1 to AL5 respectively disposed between the above-mentioned members. The first to fifth adhesive layers AL1 to AL5 may attach members adjacent to each other in a stacked structure. The first to fifth adhesive layers AL1 to AL5 may include a pressure sensitive adhesive or an optical clear adhesive, however, should not be particularly limited.

According to an embodiment, some of the above-described members may be omitted. In an embodiment, for instance, one of the first cushion layer C1 and the second cushion layer C2 and the adhesive layers related to the one cushion layer may be omitted. In addition, the display device DD may include other members in addition to the above-described members. In an embodiment, for example, the display device DD may further include an anti-reflective layer, a heat dissipation layer and the like.

The display module DM may include a first folding display area FDA1 at which the display panel DP is out-foldable, a second folding display area FDA2 at which the display panel DP is in-foldable, a first display area DA1, a second display area DA2 and a third display area DA3 that respectively correspond to the first folding area FA1, the second folding area FA2, the first non-folding area NFA1, the second non-folding area NFA2 and the third non-folding area NFA3. In an embodiment, at the first folding display area FDA1 the display panel DP is out-foldable at a first curvature radius R1, and at the second folding display area FDA2 the display panel DP is in-foldable at a second curvature radius R2. In the present disclosure, the expression "an area/portion corresponds to another area/portion" means that "an area/portion overlaps another area/portion" (such as along the thickness direction) and the "areas and portions" should not be limited to have the same size as each other. Components of the display module DM described later may include the five areas as described above.

As shown in FIG. 2B, the display module DM may include at least a display panel DP. The display panel DP may be a light emitting type display panel, however, should not be particularly limited. In an embodiment, for instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot and a quantum rod.

The display module DM may further include an input sensor ISL (e.g., input sensing layer). The input sensor ISL may be disposed directly on the display panel DP. The input sensor ISL may include a plurality of electrodes (e.g., sensing electrodes). The input sensor ISL may sense an external input by a self-capacitance method or a mutual capacitance method. The input sensor ISL may also sense an input generated by an active type input device.

The display module DM may further include an anti-reflective layer RPL to decrease a reflectance of an external light. The anti-reflective layer RPL may further include color filters. The color filters may be disposed to overlap pixels of the display panel DP. A blue color filter may be disposed on a blue pixel, a red color filter may be disposed on a red pixel and a green color filter may be disposed on a green pixel. A black matrix may be disposed on a boundary between the color filters.

Referring to FIG. 2A again, the window WIN may be disposed on the display module DM. The window WIN may protect the display module DM from external scratches. The window WIN may have an optically transparent property.

The window WIN may include a synthetic resin film as a base layer. The window WIN may include a polyimide film. However, the window WIN should not be limited thereto or thereby, and the window WIN may include a glass substrate. The window WIN may include an ultra-thin glass ("UTG").

The window WIN may further include an anti-fingerprint layer and/or a hard coating layer which is on the base layer. The anti-fingerprint layer and the hard coating layer should not be particularly limited.

The window protective layer WP may be disposed on the window WIN. The window protective layer WP may face the display module DM with the window WIN therebetween. The window protective layer WP may be attachable to and detachable from the window WIN. The first adhesive layer AL1 may have an adhesion smaller than an adhesion of the second to fifth adhesive layers AL2 to AL5. When the window protective layer WP is damaged such as by an external pressure, the window protective layer WP which is damaged may be replaced with a window protective layer WP which is new. The window protective layer WP may include a flexible synthetic resin film, such as a polyimide, polyethylene terephthalate, or polyurethane film, as a base layer.

Referring to FIG. 2C, the window protective layer WP may have a multi-layer structure. The window protective layer WP may include a polyurethane film SRL1 and a polyethylene terephthalate film SRL2 which are attached to each other by a window protective adhesive layer AL-I. The stacked structure of the window protective layer WP should not be limited thereto or thereby.

Referring to FIG. 2A again, the protective layer PF may be disposed under the display module DM and facing the window WIN with the display module DM therebetween. The protective layer PF may protect a lower portion of the display module DM. The protective layer PF may include plastic such as a plastic film. In an embodiment, for example, the protective layer PF may include a polyimide film, however, should not be limited thereto or thereby.

The impact resistance layer IRL may be disposed under the protective layer PF. The impact resistance layer IRL may include at least two portions. The protective layer PF may be disconnected to define the two portions. The impact resistance layer IRL may include a first portion P1 overlapping or corresponding to the first display area DA1, the first folding display area FDA1 and a portion of the second display area DA2, and a second portion P2 overlapping or corresponding to another portion of the second display area DA2, the second folding display area FDA2 and the third display area DA3. The impact resistance layer IRL may be disconnected to define the first portion P1 and the second portion P2. A gap GP may be defined between the first portion P1 and the second portion P2.

The first portion P1 may have an elastic modulus greater than that of the second portion P2. The elastic modulus of the first portion P1 may be within a range from about 100 gigapascals (GPa) to about 200 GPa, and the elastic modulus of the second portion P2 may be within a range from about 4 GPa to about 10 GPa. The first portion P1 may include metal such as a metal sheet, and the second portion P2 may include plastic such as a plastic film. The metal sheet may include Invar or steel use stainless ("SUS"), and the plastic film may include a polyimide film. As described with reference to FIG. 1B, the first curvature radius R1 may have a value greater than that of the second curvature radius R2 to allow the first portion P1 having the relatively larger elastic modulus to be smoothly folded. In an embodiment, the display device DD may include in order from the window WIN, a display module DM including a first display area DA1, a second display area DA2 and a third display area DA3 consecutively arranged, an impact resistance layer IRL including both of a metal sheet corresponding to the first display area DA1 and a plastic film corresponding to the third display area DA3, and a support plate SP including a first area SP-1 corresponding to the first display area DA1, a second area SP-2 corresponding to the second display area DA2, a first folding area SP-F1 which is between the first area SP-1 and the second area SP-2 and at which the support plate SP is out-foldable together with the display module DM, a third area SP-3 corresponding to the third display area DA3, and a second folding area SP-F2 which is between the second area SP-2 and the third area SP3 and at which the support plate SP is in-foldable together with the display module DM. The support plate SP which is both out-folded at the first folding area SP-F1 and in-folded at the second folding area SP-F2 disposes the first display area DA1 and the second display area DA2 facing in opposite directions, the second display area DA2 and the third display area DA3 facing each other, and the first display area DA1, the metal sheet of the impact resistance layer IRL, the second display area DA2, the third display area DA3 and the plastic film of the impact resistance layer IRL in order along a thickness direction.

Within the impact resistance layer IRL, the first portion P1 and the second portion P2 may have substantially the same thickness along the third direction DR3 as each other. Accordingly, a flat base surface may be provided when the first cushion layer C1 described later is provided or formed.

As shown in FIGS. 1A and 1B, the first portion P1 may improve resistance against the external impacts applied to the window WIN in the display device DD which includes the first display area DA1 which is outwardly folded (e.g., out-folded). It is sufficient that the first portion P1 overlaps or corresponds to the first display area DA1 to improve the impact resistance of the first portion P1.

However, as the first portion P1 further covers the first folding display area FDA1 and the portion of the second display area DA2, components disposed under the first portion P1 may not be perceived from outside the display device DD when the display device DD is viewed from a top of the window protective layer WP (e.g., top plan view). As shown in FIGS. 1A and 1B, the display device DD which is folded disposes the first folding area FA1 exposed to outside the display device DD, however, the first portion P1 covers a first folding area SP-F1 of the support plate SP, and thus, a difference in visibility due to openings OP defined in the support plate SP may not be visible from outside the display device DD.

FIG. 2D shows a result of comparing the impact resistance characteristics of an embodiment of a display device DD (display device 100 in FIG. 2D) and a comparative display device 200. According to the embodiment example, a pen-drop test is performed after an Invar sheet is applied to the first portion P1 of the impact resistance layer IRL. According to the comparative example, a pen-drop test is performed after a polyimide film having the same thickness as that of the Invar sheet is applied to the first portion P1 of the impact resistance layer IRL. The display devices 100 and 200 may have the same stacked structure as shown in FIG. 2A except for the impact resistance layer IRL.

According to the embodiment example, when the pen was dropped at about 9 centimeters (cm) in height, the display panel DP of the display device 100 was damaged in some test examples, and when the pen was dropped at about 10 cm in height, the display panel DP was damaged in some test examples. According to the comparison example, when the pen was dropped at about 7 cm in height, the display panel DP of the comparative display device 200 was damaged in some test examples, and when the pen was dropped at about 8 cm in height, the display panel DP was damaged in some test examples. On average, according to the embodiment example, the display panel DP was damaged when the pen was dropped at about 9.6 cm in height, and according to the comparison example, the display panel DP was damaged when the pen was dropped at about 7.8 cm in height. Since the Invar sheet has a high rigidity and a high resilience compared with those of the polyimide film and has a high impact resistance to the pen drop, the above results were obtained.

Referring to FIG. 2A again, the first cushion layer C1 may be disposed under the impact resistance layer IRL. The first cushion layer C1 may absorb the external impact applied to the display module DM and may reduce or effectively prevent the display module DM from being damaged. The first cushion layer C1 may have an elasticity and may include a foam resin, a sponge, polyurethane or the like. The first cushion layer C1 may be a resin layer provided using the impact resistance layer IRL as a base layer. Accordingly, an adhesive layer may not be disposed between the first cushion layer C1 and the impact resistance layer IRL. The first cushion layer C1 may be disposed on a surface of the impact resistance layer IRL which is furthest from the display module DM among first and second surfaces facing each other along the thickness direction of the impact resistance layer IRL. That is, within the impact resistance layer IRL each of the first portion P1 and the second portion P2 includes a first surface closest to the display panel DP and a second surface which is opposite to the first surface.

When the display device DD is viewed from an upper side of the window protective layer WP, the first cushion layer C1 may have a color such that the components disposed under the first cushion layer C1 are not viewable from outside the display device DD. The first cushion layer C1 may include a material that absorbs the light.

The support plate SP is disposed under the first cushion layer C1. The support plate SP may include a material having an elastic modulus equal to or greater than about 60 GPa. The support plate SP may include a metal material such as stainless steel, however, should not be limited thereto or thereby. The support plate SP may include various metal materials.

The support plate SP may include a first folding area SP-F1, a second folding area SP-F2, a first area SP-1, a second area SP-2 and a third area SP-3, which respectively correspond to the first folding area FA1, the second folding area FA2, the first non-folding area NFA1, the second non-folding area NFA2 and the third non-folding area NFA3. The first folding area SP-F1 and the second folding area SP-F2 may include a material or structure having a lower repulsive force against a folding force than that of the first area SP-1, the second area SP-2 and the third area SP-3. In other words, the first folding area SP-F1 and the second folding area SP-F2 may include the material or structure by which the support plate SP is more easily folded than at the first area SP-1, the second area SP-2 and the third area SP-3. This will be described in detail later.

The first folding area SP-F1 and the second folding area SP-F2 provided to correspond to the first folding area FA1 and the second folding area FA2 may have different widths from each other along the first direction DR1. The first folding area SP-F1 may have a width greater than a width of the second folding area SP-F2 along the first direction DR1. That is, the width of the first folding area SP-F1 at which the support plate SP is out-foldable together with the display module DM is greater than the width of the second folding area SP-F2 at which the support plate SP is in-foldable together with the display module DM.

The second cushion layer C2 may be disposed under the support plate SP. FIG. 2A shows a resin layer provided using the support plate SP as a base layer as a representative example of the second cushion layer C2, however, the second cushion layer C2 should not be limited thereto or thereby. An adhesive layer may be disposed between the support plate SP and the second cushion layer C2. The second cushion layer C2 may be provided or formed the same as or different from the first cushion layer C1 with respect to material, process, etc.

Figure 3A:
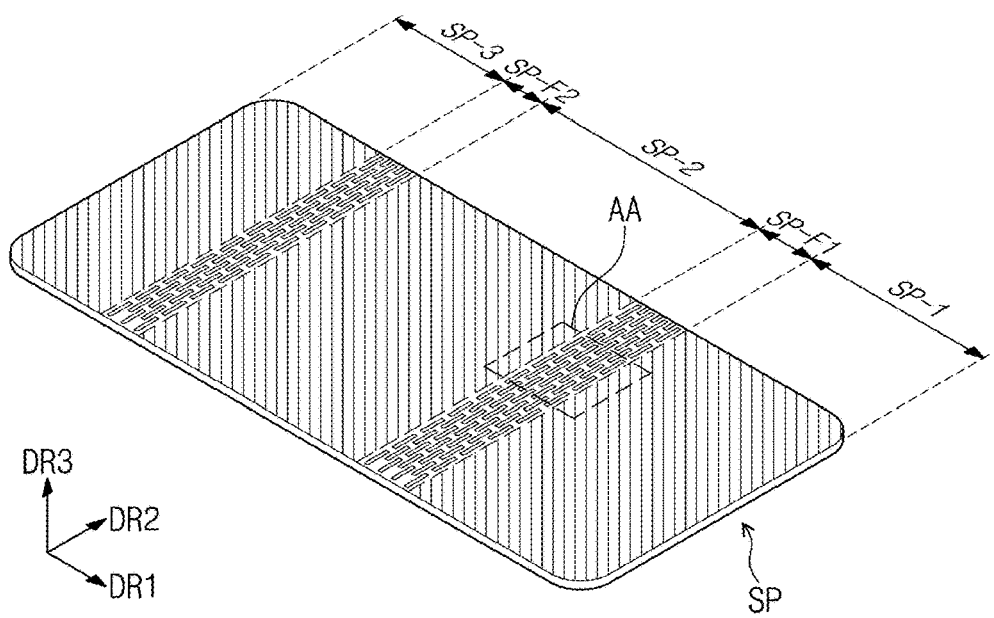
FIG. 3A is a perspective view showing an embodiment of a support plate which is unfolded.
Figure 3B:
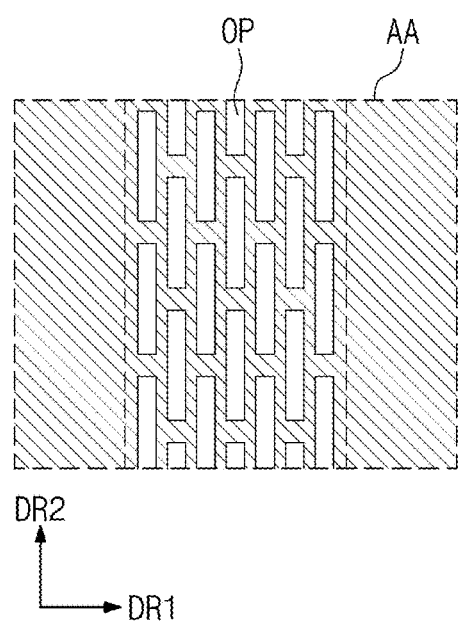
FIG. 3B is a plan view showing an embodiment of portion AA of FIG. 3A.

FIG. 3A is a perspective view showing an embodiment of the support plate SP which is unfolded, and FIG. 3B is a plan view showing an embodiment of portion AA of FIG. 3A.

Referring to FIGS. 3A and 3B, the support plate SP may include the first folding area SP-F1, the second folding area SP-F2, the first area SP-1, the second area SP-2 and the third area SP-3. Each of the first folding area SP-F1 and the second folding area SP-F2 may be provided with an opening OP provided in plural including a plurality of openings OP defined therethrough.

The openings OP may be arranged in a pattern, at a spacing, etc. The openings OP may be arranged in a lattice shape. As the openings OP are defined in the first folding area SP-F1 and the second folding area SP-F2, a size of the first folding area SP-F1 and a size of the second folding area SP-F2 may be reduced, and the rigidity of the first folding area SP-F1 and the second folding area SP-F2 may be lowered. Accordingly, the support plate SP at the first folding area SP-F1 and the second folding area SP-F2 may be folded more easily than when the openings OP are excluded from a respective folding area.

Figure 4A:
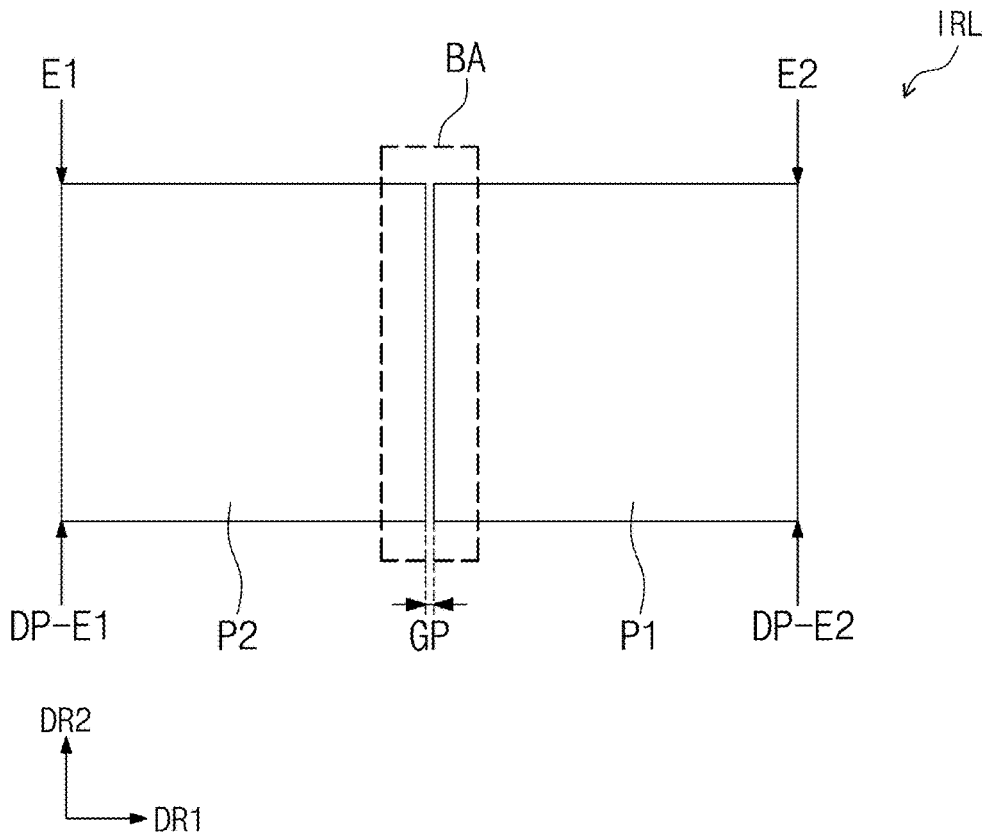
FIG. 4A is a plan view showing an embodiment of an impact resistance layer which is unfolded.
Figure 4B:
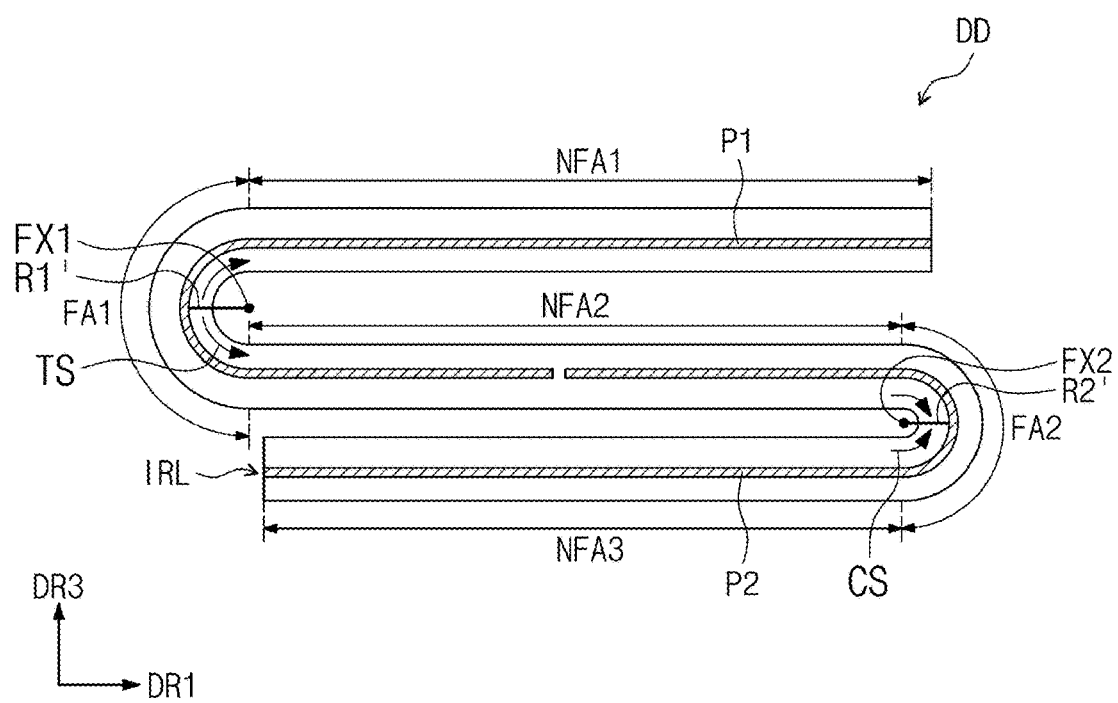
FIG. 4B is a view showing a stress generated in an embodiment of the display device which is folded.

FIG. 4A is a plan view showing an embodiment of the impact resistance layer IRL which is unfolded. FIG. 4B is a view showing an embodiment of a stress generated in the display device DD which is folded. FIG. 4C is a photograph image showing an embodiment of a display device DD which is unfolded.

Referring to FIG. 4A, a boundary area BA is defined between the first portion P1 and second portion P2. Inner edges of the first portion P1 and the second portion P2 may face each other at the boundary area BA. The gap GP between the first portion P1 and the second portion P2 in the boundary area BA between the first portion P1 and second portion P2 may be equal to or smaller than about 100 micrometers. In an embodiment, inner edges of first portion P1 and an edge of the second portion P2 are in contact with each other, however, the inner edge of the first portion P1 and the inner edge of the second portion P2 may be spaced apart from each other within a process tolerance. As being in contact, elements may form an interface therebetween.

Referring to FIG. 2B, the display panel DP may have outer side edges opposing each other along the first direction DR1 and including a first outer edge DP-E1 and a second outer edge DP-E2. Referring to FIG. 4A, the impact resistance layer IRL may have outer side edges opposing each other along the first direction DR1 and including a first outer edge E1 and a second outer edge E2. The first portion P1 defines the first outer edge E1 and the second portion P2 defines the second outer edge E2. The display panel DP includes a length along the first direction DR1 taken from the first outer edge DP-E1 of the display panel DP. The display panel DP includes a center portion along the first direction DR1 at about 45% to about 55% of the length taken from the first outer edge DP-E1.

FIG. 4A is illustrated under the assumption that the first outer edge DP-E1 of the display panel DP shown in FIG. 2B overlaps or corresponds to the first outer edge E1 of the first portion P1 and the second outer edge DP-E2 of the display panel DP overlaps or corresponds to the second outer edge E2 of the second portion P2. It an embodiment, a boundary between the first portion P1 and the second portion P2 is disposed within a range of about 45% to about 55% (hereinafter, referred to as a center portion) of a length in the first direction DR1 of the display panel DP from the first outer edge DP-E1 of the display panel DP. The display device DD which is unfolded defines the length along the first direction DR1 of the display panel DP as a distance from the first outer edge DP-E1 to the second outer edge DP-E2 when the display device DD.

As shown in FIG. 4B, the display device DD which is folded may define a compressive force or stress or a tensile force or stress between the first folding area FA1 and the second folding area FA2. The components of the display device DD may receive the compressive force or stress or the tensile force or stress depending on a location along the display device DD. Referring to FIGS. 1B, 2B and 4B, in an embodiment, the display panel DP which is both out-folded at the first folding display area FDA1 and in-folded at the second folding display area FDA1 disposes the first display area DA1 and the second display area DA2 facing in opposite directions, the second display area DA2 and the third display area DA3 facing each other, and the first display area DA1, the first portion P1 of the impact resistance layer IRL, the second display area DA2, the third display area DA3 and the second portion P2 of the impact resistance layer IRL in order along a thickness direction.

The first to fifth adhesive layers AL1 to AL5 described with reference to FIG. 2A may alleviate the compressive force stress or the tensile force stress. Referring again to FIG. 4B, tensile stress TS may occur in the first portion P1 folded at a first curvature radius R1', and compressive stress CS may occur in the second portion P2 which is folded at a second curvature radius R2', however, should not be limited thereto or thereby. The first curvature radius R1' and the second curvature radius R2' may correspond to those described above for the display device DD. The stress occurring in the first portion P1 and the second portion P2 may be determined depending on the stacked position of the components along a thickness direction of the display device DD and the elastic modulus of other components. In an embodiment, for instance, the compressive stress CS may occur in the first portion P1 and the tensile stress TS may occur in the second portion P2.

The tensile stress TS and the compressive stress CS occurring in the first folding area FA1 and the second folding area FA2 may cause a shear stress in the second non-folding area NFA2. Although the stress occurs in the portion of the second non-folding area NFA2 which is closer to the first folding area FA1 and the portion which is closer to the second folding area FA2, a shear stress occurring in an area corresponding to the center portion of the second non-folding area NFA2 which is further from a respective folding area may be small or there may be no stress. In particular, the shear stress in the area of the second non-folding area NFA2 corresponding to a center of the second non-folding area NFA2 may be close to zero.

Even though folding and unfolding of the display device DD are performed, the fourth adhesive layer AL4 (refer to FIG. 2A) which extends across the boundary area BA of the impact resistance layer IRL which is disconnected at the gap GP is unlikely to be deformed due to the shear stress in the boundary area BA between the first portion P1 and the second portion P2. In an embodiment, for instance, the fourth adhesive layer AL4 does not infiltrate into a gap GP between the first portion P1 and the second portion P2. Aggregation of other adhesive layers AL1 to AL3 and AL5 caused by a decrease in resilience is also unlikely to occur in the boundary area BA. This is because the shear stress does not affect the adhesive layers AL1 to AL5 in the boundary area BA.

FIG. 4C is a photograph image showing the display device DD taken in a direction from the window WIN to the display module DM using an Optimap facility. It is observed from the analyzed results in the image with respect to the boundary area BA and an area surrounding the boundary area BA that the boundary between the first portion P1 and the second portion P2 was not noticeable compared to other areas.

Figure 5A:
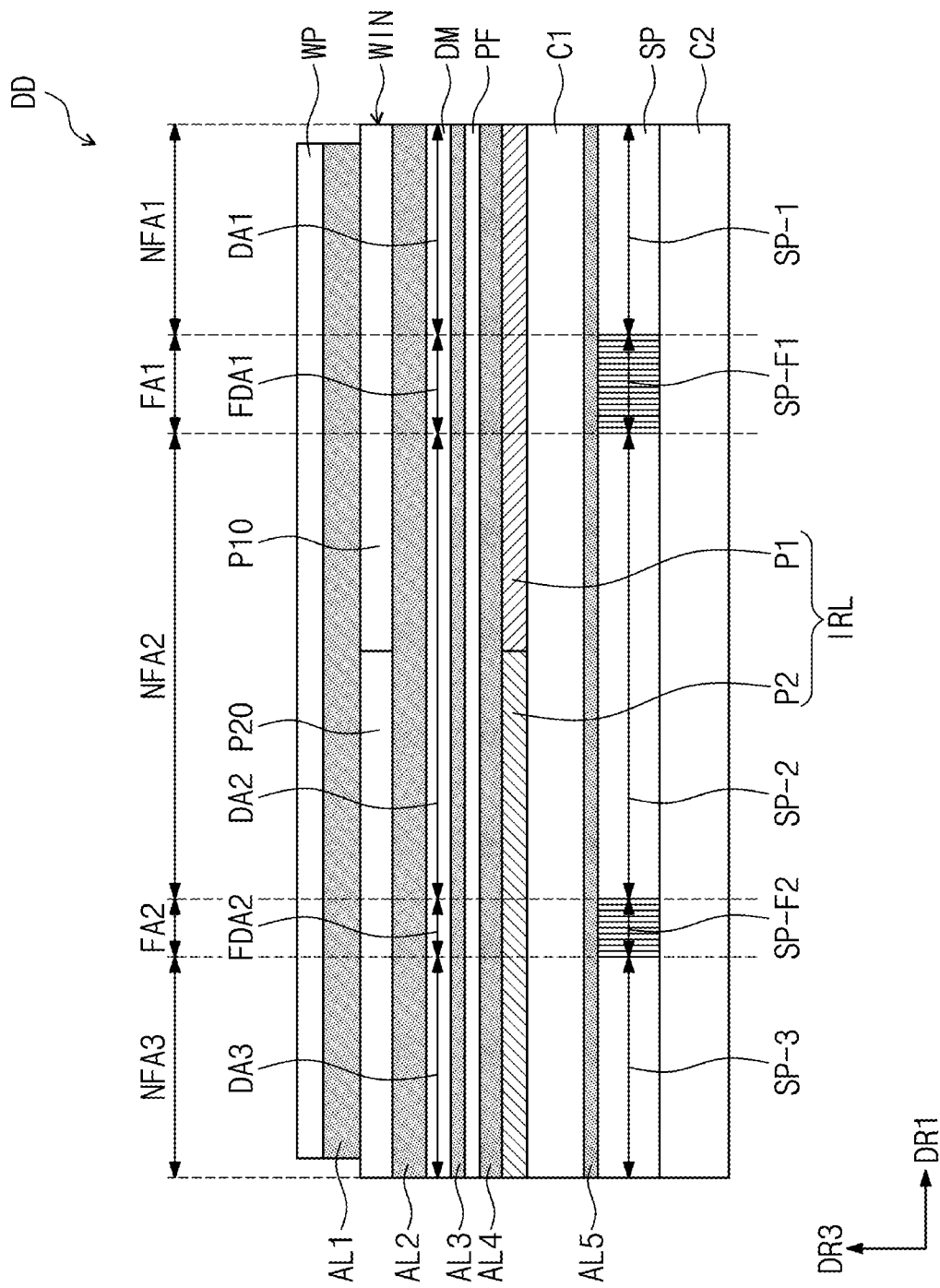
FIG. 5A is a cross-sectional view showing an embodiment of a display device which is unfolded.
Figure 5B:
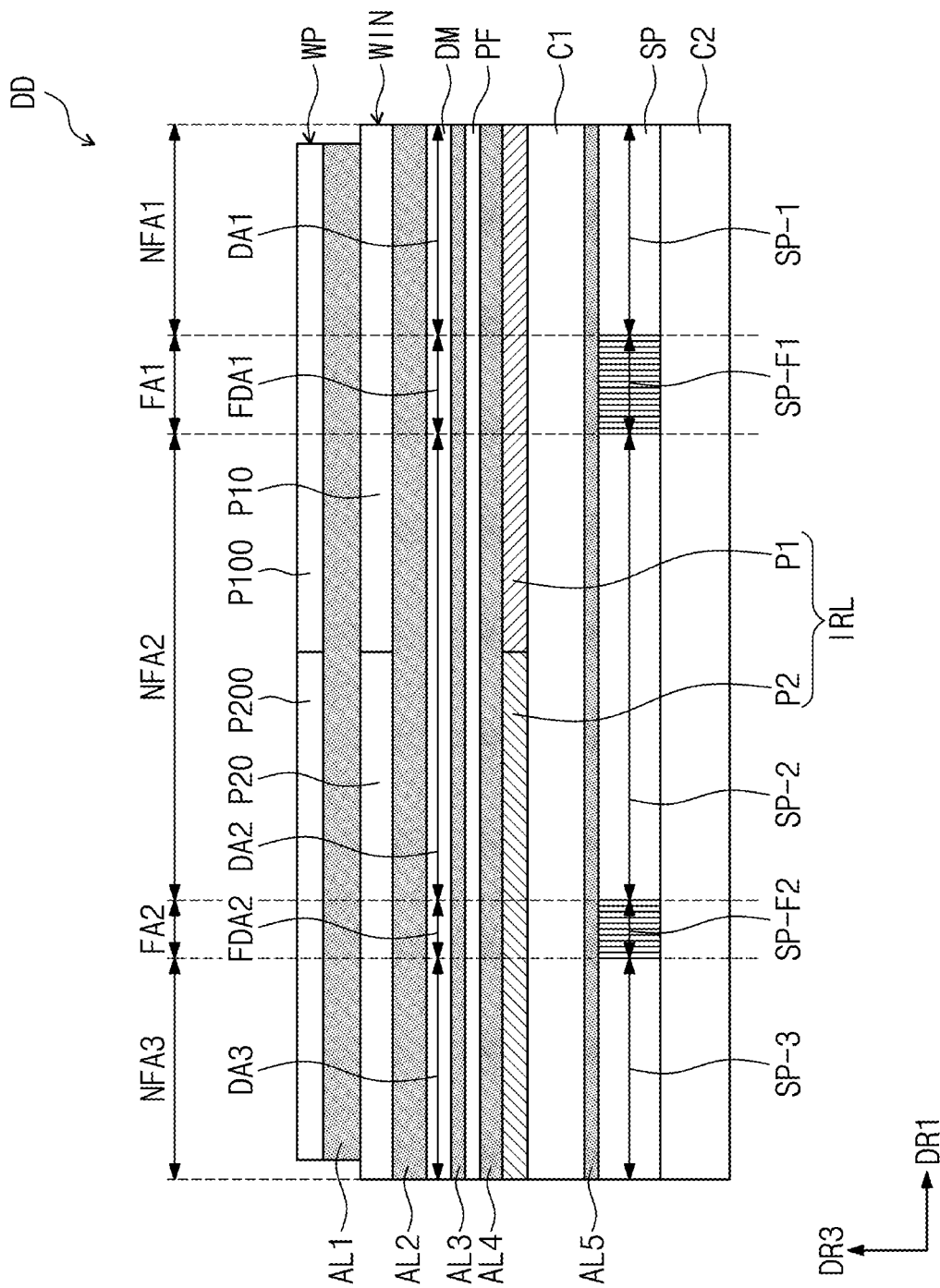
FIG. 5B is a cross-sectional view showing an embodiment of a display device which is unfolded.
Figure 6:
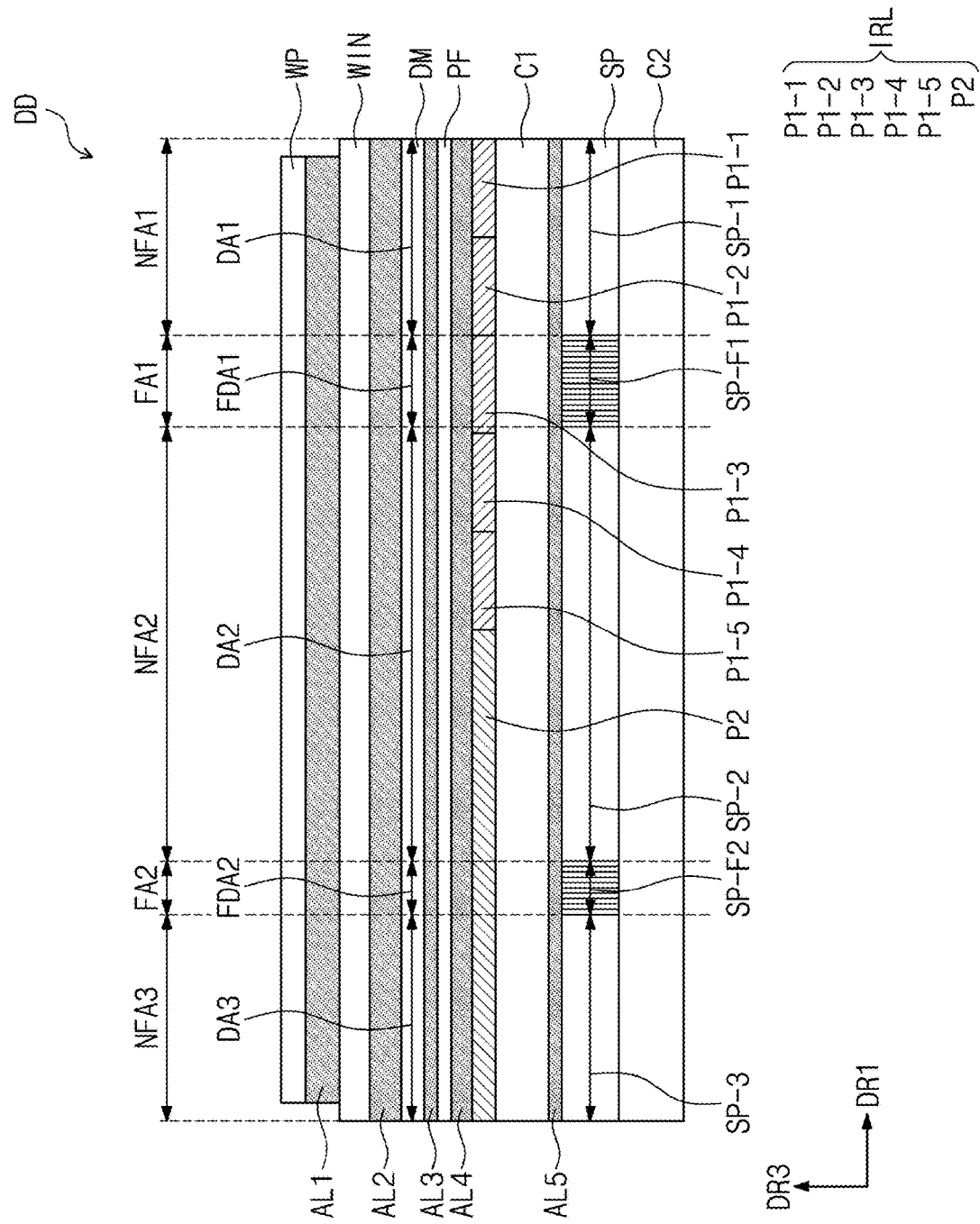
FIG. 6 is a cross-sectional view showing an embodiment of a display device which is unfolded.
Figure 7:
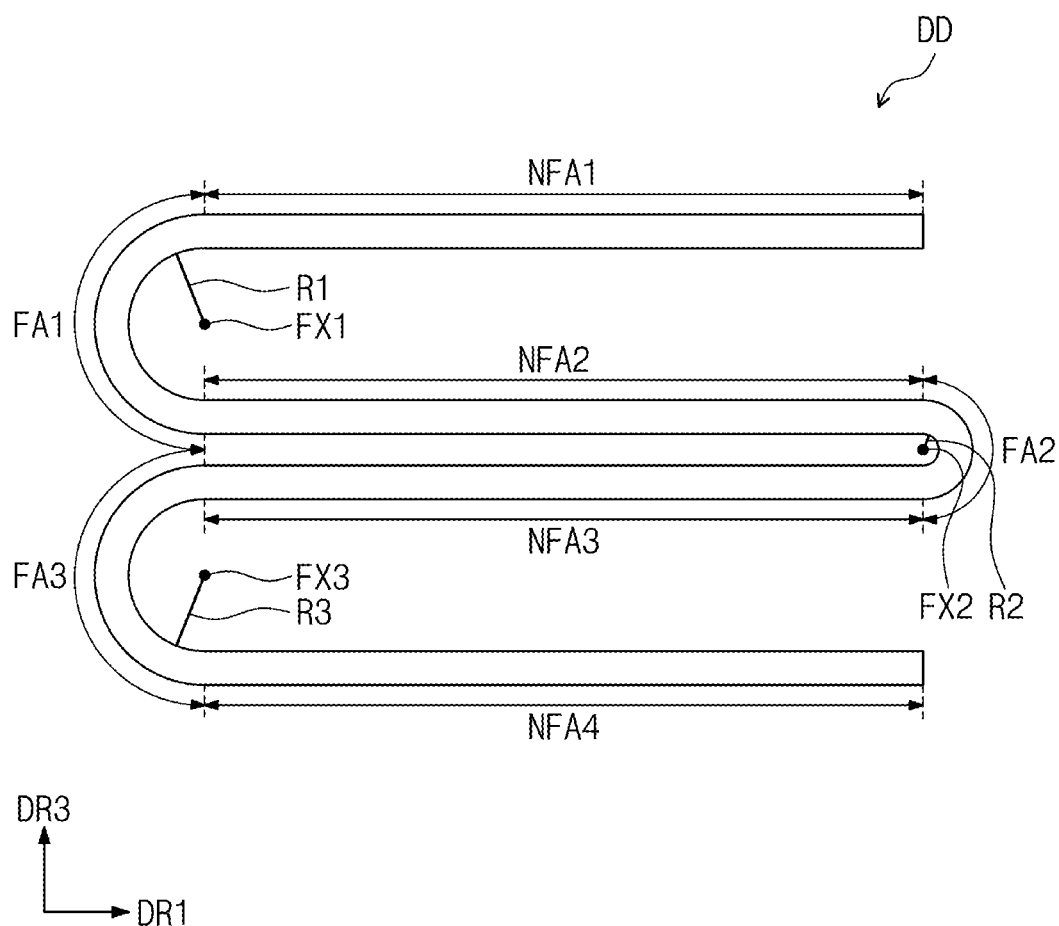
FIG. 7 is a side view showing an embodiment of a display device which is folded.

FIG. 5A is a cross-sectional view showing an embodiment of a display device DD which is unfolded. FIG. 5B is a cross-sectional view showing an embodiment of a display device DD which is unfolded. FIG. 5C is a cross-sectional view showing an embodiment of a display device DD which is unfolded. FIG. 6 is a cross-sectional view showing an embodiment of a display device DD which is unfolded. FIG. 7 is a cross-sectional side view showing an embodiment of a display device DD which is unfolded. Hereinafter, detailed descriptions of the same elements as those described with reference to FIGS. 1 to 4C will be omitted.

Referring to FIGS. 5A to 5C, other layers in addition to an impact resistance layer IRL may include respectively first portions P10, P100 and P1000 and second portions P20, P200 and P2000. The first portions P10, P100 and P1000 may respectively overlap or correspond to at least a first display area DA1. The first portions P10, P100 and P1000 may respectively overlap or correspond to the first display area DA1, a first folding display area FDA1 and a portion of a second display area DA2.

The first portions P10, P100 and P1000 may have an elastic modulus greater than an elastic modulus of the second portions P20, P200 and P2000. However, a numerical range of the elastic modulus should not be limited to a numerical range of the first portion P1 and the second portion P2 of the impact resistance layer IRL described above.

A window WIN may include the first portion P10 and the second portion P20 as shown in FIG. 5A, a window protective layer WP may include the first portion P100 and the second portion P200 as shown in FIG. 5B, and the protective layer PF may include the first portion P1000 and the second portion P2000 as shown in FIG. 5C. Descriptions on arrangements and thicknesses of the first portions P10, P100 and P1000 and the second portions P20, P200 and P2000 may be replaced with the above descriptions of the first portion P1 and the second portion P2. As described above, portions having high rigidity in each of various members are disposed in the area overlapping a first non-folding area NFA1, and thus, the damage of the display module DM within the display device DD which is folded may be reduced or effectively prevented due to the impact resistance provided by the various layers described above.

Referring to FIG. 6, an impact resistance layer IRL may include a plurality of first portions P1-1 to P1-5. The first portions P1-1 to P1-5 may be disposed in the area in which the first portion P1 shown in FIG. 2A is disposed. FIG. 6 shows five of the first portions P1-1 to P1-5 as a representative example, however, the number of the first impact resistance layer portions should not be limited to five. The first portions P1-1 to P1-5 may have the same or different widths along the first direction DR1. Referring to FIG. 4A together with FIG. 6, a boundary area BA may be defined between the first portions P1-2 to P1-5 which are respectively adjacent to each other. That is, the impact resistance layer IRL may be disconnected at multiple locations along the first direction DR1 to define boundaries between respective first impact resistance layer portions.

Referring to FIG. 7, the display device DD may further include a third folding area FA3 at which the display device DD is foldable at a third curvature radius R3 and a fourth non-folding area NFA4. The third curvature radius R3 may be substantially the same as the first curvature radius R1, however, should not be particularly limited.

As the third folding area FA3 is outwardly folded (e.g., out-folded), a symmetry-type display device DD may be provided. Descriptions for the third folding area FA3 and the fourth non-folding area NFA4 may be replaced with the above descriptions of the first folding area FA1 and the first non-folding area NFA1.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the invention shall be determined according to the attached claims.

What is claimed is:

1. A display device comprising:
    a display module comprising a display panel including a first display area, a second display area and a third display area, a first folding display area which is between the first display area and the second display area and at which the display module is out-foldable, and a second folding display area which is between the second display area and the third display area and at which the display module is in-foldable; and
    an impact resistance layer facing the display module, the impact resistance layer comprising:
        a first portion corresponding to the first display area of the display module and having an elastic modulus,
        a second portion corresponding to the third display area of the display module and having an elastic modulus,
        the second portion spaced apart from the first portion in a first direction along the display module, to define a gap between the first portion and the second portion at which the display module is exposed to outside the impact resistance layer, and
        the gap which exposes the display module to outside the impact resistance layer spaced apart from each of the first folding display area and the second folding display area along the first direction of the display module,
    wherein
    the elastic modulus of the first portion is greater than the elastic modulus of the second portion, and
    the display module which is both out-folded at the first folding display area and in-folded at the second folding display area disposes:
        the first display area and the second display area facing in opposite directions,
        the second display area and the third display area facing each other, and
        the first display area, the first portion of the impact resistance layer, the second display area, the third display area and the second portion of the impact resistance layer in order.

2. The display device of claim 1, wherein within the impact resistance layer,
    the first portion further corresponds to the first folding display area and a portion of the second display area, and the second portion further corresponds to the second display area and another portion of the second folding display area.

3. The display device of claim 1, wherein
at the first folding display area the display module is out-foldable at a first curvature radius,
at the second folding display area the display module is in-foldable at a second curvature radius, and
the first curvature radius is greater than the second curvature radius.

4. The display device of claim 1, wherein within the impact resistance layer,
the elastic modulus of the first portion is from about 100 gigapascals to about 200 gigapascals, and
the elastic modulus of the second portion is from about 4 gigapascals to about 10 gigapascals.

5. The display device of claim 1, wherein within the impact resistance layer,
the first portion comprises metal, and
the second portion comprises plastic.

6. The display device of claim 5, wherein within the impact resistance layer the metal comprises Invar or stainless steel.

7. The display device of claim 1, wherein within the impact resistance layer the first portion and the second portion have substantially a same thickness as each other.

8. The display device of claim 1, wherein the gap between the first portion and the second portion is equal to or smaller than about 100 micrometers.

9. The display device of claim 1, wherein the first display area, the first folding display area, the second display area, the second folding display area, and the third display area are consecutively arranged in the first direction, and a boundary between the first portion and the second portion is disposed at a portion within a range of about 45% to about 55% of a length in the first direction of the display module from one side edge of the display module.

10. The display device of claim 1, further comprising a first cushion layer facing the display module with the impact resistance layer therebetween,
wherein
within the impact resistance layer each of the first portion and the second portion comprises a first surface closest to the display module and a second surface which is opposite to the first surface, and
the first cushion layer is directly on the second surface of each of the first portion and the second portion.

11. The display device of claim 1, further comprising a support plate facing the display module with the impact resistance layer therebetween,
wherein the support plate comprises a first area, a second area, a first folding area, a third area and a second folding area respectively corresponding to the first display area, the second display area, the first folding display area, the third display area and the second folding display area of the display module.

12. The display device of claim 11, wherein within the support plate each of the first folding area and the second folding area defines a plurality of openings of the support plate.

13. The display device of claim 1, wherein the display module further comprises a protective film between the display panel and the impact resistance layer.

14. The display device of claim 1, further comprising a window facing the impact resistance layer with the display panel therebetween.

15. The display device of claim 14, further comprising a window protective layer facing the display panel with the window therebetween,
wherein the window protective layer is attachable to and detachable from the window.

16. The display device of claim 1, further comprising an input sensing layer on the display panel.

17. A display device comprising:
a window; and
in order from the window:
a display module comprising a first display area, a second display area and a third display area consecutively arranged;
an impact resistance layer comprising:
a metal sheet corresponding to the first display area,
a plastic film corresponding to the third display area,
the plastic film spaced apart from the metal sheet in a first direction along the display module, to define a gap between the metal sheet and the plastic film at which the display module is exposed to outside the impact resistance layer, and
the gap which exposes the display module to outside the impact resistance layer spaced apart from each of the first folding display area and the second folding display area along the first direction of the display module; and
a support plate comprising a first area corresponding to the first display area, a second area corresponding to the second display area, a first folding area which is between the first area and the second area and at which the support plate is out-foldable together with the display module, a third area corresponding to the third display area, and a second folding area which is between the second area and the third area and at which the support plate is in-foldable together with the display module;
wherein
the support plate which is both out-folded at the first folding area and in-folded at the second folding area disposes:
the first display area and the second display area facing in opposite directions,
the second display area and the third display area facing each other, and
the first display area, the metal sheet of the impact resistance layer, the second display area, the third display area and the plastic film of the impact resistance layer in order.

18. The display device of claim 17, wherein the display module comprises:
a display panel;
an input sensor disposed on the display panel; and
a protective film disposed under the display panel.

19. The display device of claim 17, wherein within the support plate:
the first area, the first folding area, the second area, the second folding area and the third area are consecutively arranged along the first direction,
each of the first folding area and the second folding area has a width along the first direction, and
the width of the first folding area at which the support plate is out-foldable together with the display module is greater than the width of the second folding area at which the support plate is in-foldable together with the display module.

20. The display device of claim 19, wherein within the support plate each of the first folding area and the second folding area defines a plurality of openings of the support plate.

21. The display device of claim 17, wherein the gap corresponds to the second area of the support plate.

* * * * *